United States Patent [19]

Babich et al.

[11] Patent Number: 4,603,195
[45] Date of Patent: Jul. 29, 1986

[54] ORGANOSILICON COMPOUND AND USE THEREOF IN PHOTOLITHOGRAPHY

[75] Inventors: Edward D. Babich, Peekskill; Michael Hatzakis, Chappaqua; Jurij R. Paraszczak, Ossining, all of N.Y.; Jane M. Shaw, Ridgefield, Conn.

[73] Assignee: International Business Machines Corporation, Armonk, N.Y.

[21] Appl. No.: 567,305

[22] Filed: Dec. 30, 1983

[51] Int. Cl.$^4$ .................... G03C 1/52; C07C 113/00; C08G 77/40
[52] U.S. Cl. .................... 534/564; 534/560; 534/561; 534/562; 534/563; 430/193; 528/28; 528/27
[58] Field of Search ............... 260/141 D; 528/28, 27; 534/564, 560, 561, 562, 563; 430/193

[56] References Cited

U.S. PATENT DOCUMENTS 4,283,249  8/1981  Ephrath .............................. 156/643

FOREIGN PATENT DOCUMENTS 58-48045  3/1983  Japan .

OTHER PUBLICATIONS

Elsevier Scientific Publications, Amsterdam 1981, Chapter 8, "Quinonediazides in Practical Applications," Erschoo, et al., pp. 282-297.
Journal of the Electrochemical Society, vol. 127, No. 3, Mar. 1980, Deckert, et al., "Microlithography-Key to Solid-State Fabrication", pp. 45C-56C.
Fried, et al., IBM, Journal Research Development, vol. 26, No. 3, pp. 362-371.
Roberts, Journal of Electrochemical Society, vol. 120, p. 1716, 1973.
Gazard, et al., Applied Polymer Symposium, No. 23, pp. 107-116, 1974.
Hatzakis, et al., Processing Microcircuit Engineering (Lausanne), p. 396, Sep. 1981.
Shaw, et al., "Organosilicon Polymers for Lithographic Applications", Polymer Engineering and Science, Dec. 1983, vol. 23, No. 18, pp. 1054-1058.
Chemical Abstracts, vol. 87, 1977, pp. 631-632, "Organometallic and Organometalloidal Compounds", Item 87: 102402w, Kozlova, et al.
Chemical Abstracts, vol. 87, 1977, p. 511 Radiation Chem., Photochem., Item 87: 209484b, Kozlova, et al.

Primary Examiner—Charles F. Warren
Assistant Examiner—Carolyn S. Greason
Attorney, Agent, or Firm—Pollock, Vande Sande & Priddy

[57] ABSTRACT

A composition obtained by interracting a quinone diazo compound and an organosilicon compound; and use thereof in lithography.

24 Claims, No Drawings

ORGANOSILICON COMPOUND AND USE THEREOF IN PHOTOLITHOGRAPHY

TECHNICAL FIELD

The present invention is concerned with organosilicon materials and especially organosilicon materials which are capable of being imaged upon exposure to actinic radiation. In addition, the present invention is concerned with the use of the organosilicon materials in lithography. For instance, the materials of the present invention are suitable for imaging on all optical lithography tools and for packaging applications such as multilayer ceramic packaging devices.

BACKGROUND ART

In the manufacture of patterned devices such as semiconductor chips and chip carriers the steps of etching different layers which constitute the finished product are among the most critical and crucial steps involved. One method widely employed for etching is to overlay the surface to be etched with a suitable mask and then immersing the substrate and mask in a chemical solution which attacks the surface to be etched while leaving the mask intact. These wet chemical processes suffer from the difficulty of achieving well-defined edges on the etched surfaces. This is due to the chemicals undercutting the mask such as by chemicals seeping under the mask and thereby continuing to attack the surface to be etched (isotropic etching), even under portions of the masked area. Such wet etching processes are also undesirable because of the environmental and safety concerns associated therewith.

Accordingly, various so-called "dry processes" have been suggested in the hope of improving the process from an environmental viewpoint, as well as reducing the relative cost of the etching. Moreover, the so-called "dry processes" have the potential advantage of greater process control, and higher aspect ratio images.

Such "dry processes" generally involve passing a gas through a container and creating a plasma in this gas. The species in this plasma are then used to etch a substrate placed in the chamber or container. Typical examples of such "dry processes" are plasma etching, sputter etching, and reactive ion etching.

Reactive ion etching provides well-defined vertically etched sidewalls. A particular reactive ion etching process is disclosed, for example, in U.S. Pat. No. 4,283,249 to Ephrath, disclosure of which is incorporated herein by reference.

One problem associated with "dry-processing" techniques is providing a patternable material which is sensitive to imaging radiation while, at the same time, being sufficiently resistant to the dry-etching environment. In many instances, resistance to the dry-etching such as to the plasma etching active species results in erosion of the mask material and loss of resolution of the material employed for preparing the mask in the lithographic exposure to the imaging radiation.

This is true for both positive organic resist materials and negative organic resist materials. A positive resist material is one which on exposure to imaging radiation is capable of being rendered soluble in a solvent in which the unexposed resist is not soluble. A negative resist material is one which is capable of polymerizing and/or insolubilizing upon exposure to imaging radiation.

One type of positive photosensitive material is based upon phenol-formaldehyde novolak polymers. A particular example of such is Shipley AZ1350 which is a m-cresol formaldehyde novolak polymer composition. Such is a positive resist composition and includes therein a diazoketone such as 2-diazo-1-naphthol-5-sulphonic acid ester. In such a composition, the diazoketone, during the photochemical reaction is converted to a carboxylic acid. This, in turn, converts a neutral-organic soluble molecule (the phenolic polymer) to one that is readily soluble in weakly alkali aqueous developer solvents. The composition usually contains about 15%, or so, by weight, of the diazoketone compound.

A discussion of various photoresist materials can be found, for instance, in the *Journal of the Electrochemical Society*, Vol. 125, No. 3, March 1980, Deckert, et al., "Microlithography-Key to Solid-State Fabrication", pp. 45C-56C, disclosure of which is incorporated herein by reference.

Additional discussion of the use of quinone diazides in light-sensitive applications can be found in "Quinone Diazides", Erschov, et al., *Elsevier Scientific Publications*, Amsterdam, 1981, Chapter 8, pp. 282–297, disclosure of which is incorporated herein by reference. In addition, it has been suggested therein to employ condensation products of 1,2-naphthoquinone-5-chlorosulphonic acid and certain silicon derivatives to improve the adhesion property of various films to a substrate whereby the condensation products are employed as light-sensitive backing therefor.

In addition, certain siloxanes have been suggested as reactive ion etch barriers. For instance, see Fried, et al., IBM, *Journal Research Development*, Vol. 26, No. 3, pp. 362–371. Also, certain siloxanes have been suggested as e-beam sensitive resists. For instance, see Roberts, *Journal of Electrochemical Society*, Vol. 120, p. 1716, 1973; Roberts, *Phillips Technical Review*, Vol. 35, pp. 41–52, 1975; and Gazard, et al., *Applied Polymer Symposium*, No. 23, pp. 106–107, 1974.

Moreover, there have been suggestions that certain siloxanes, when imaged with electron beam (see Hatzakis, et al., *Processing Microcircuit* Engineering (Lausanne), p. 396, September 1981); and deep U.V. at about 2537 Angstrom (see Shaw, et al., *SPE Photopolymer Conference*, November 1982) act as an etch mask for an underlying polymer layer in an oxygen plasma. However, these siloxane materials suggested require very limited methods for imaging (e.g.—e-beam and deep U.V.) and are not imageable with radiation of longer wavelengths (e.g.—greater than 2700A), where the majority of lithographic imaging tools, contact, proximity, and projection printers operate.

DISCLOSURE OF INVENTION

The present invention provides materials which are resistant to dry-processing techniques and especially to reactive ion etching in oxygen plasma while, at the same time, capable of providing high resolution images. Moreover, the materials of the present invention can be made highly sensitive to not only e-beam and deep U.V. irradiation (<3000 angstroms), but also to all forms of imaging radiation including near U.V. (about 3300 to about 4400 angstroms), mid U.V. irradiation (about 3000 to about 3300 angstroms), ion-beam irradiation, X-ray irradiation, and neutron radiation. Furthermore, materials of the present invention are thermally stable.

In addition, the present invention, depending upon the particular reactants employed, can provide positive or negative resist materials.

The present invention is concerned with a composition of matter obtained by interacting a quinone diazo compound and an organosilicon compound wherein the organosilicon compound contains groups which are reactive with reactive groups of the quinone diazo compound.

The present invention is also concerned with a process for producing an image which comprises providing on a substrate a composition containing an organosilicon-quinone diazo reaction product of the type mentioned hereinabove, exposing the composition to imaging radiation in a desired pattern; and developing the layer, thereby leaving the desired pattern remaining on the substrate.

BEST AND VARIOUS MODES FOR CARRYING OUT INVENTION

The quinone diazo compounds employed in preparing the compositions of the present invention can be referred to as quinone diazides derivatives which contain a group reactive with a reactive group of the organosilicon compound. Suitable reactive groups are acid groups and halo groups. Usually the quinone diazides are employed in accordance with the present invention are the orthodiazophenols which are often referred to as the quinone-(1,2)-diazides.

Examples of some quinone diazides include derivatives of 1,4-benzoquinonediazide; 1,2-benzoquinonediazide; 1,4-naphthoquinonediazide; 1,2-naphthoquinonediazide; 2,1-naphthoquinonediazide; 1,8-naphthoquinonediazide; 1,7-naphthoquinonediazide; 1,6-naphthoquinonediazide; 2,6-naphthoquinonediazide; and wherein the derivatives include a reactive group such as a halogen group, acid group such as $SO_3H$; and sulfonylhalide group such as $SO_2Cl$, $SO_2Br$, and $SO_2I$.

In addition to the reactive groups, the quinone diazides can contain substituents on the ring such as alkyl groups cycloalkyl groups, aryl groups, alkaryl groups, aralkyl groups, cyano groups, $NO_2$, hydroxyl, thionyl, mercapto, and $NR_1R_2$ wherein $R_1$ and $R_2$, individually, is H, or an organic radical such as alkyl and aryl.

Examples of alkyl groups are methyl, ethyl, propyl, butyl, octyl. Examples of some aryl radicals are phenyl, tolyl, xylyl, and napthyl radicals. Examples of aralkyl radicals are benzyl and phenylethyl radicals. Examples of cycloalkyl radicals are cyclohexyl and cycloheptyl.

In addition, reactive derivatives of heterocyclic analogs of the above benzoquinone diazides containing, for instance, a nitrogen, sulfur, or oxygen atom in the ring(s) can be employed.

Derivatives containing the above-discussed reactive and non-reactive substituents of the following heterocyclic analogs are examples of suitable quinone diazides:

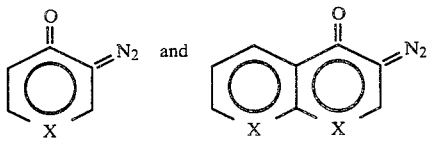

wherein X is selected from the group of O, N, S, Se, or mixtures thereof.

Further examples of suitable quinone diazides include organic metallic derivatives of the above diazides.

The preferred diazide derivatives employed in accordance with the present invention contain a halo and most preferably a chloro reactive group. Examples of some suitable quinone diazide derivatives employed in accordance with the present invention include naphthoquinone-1,2-diazide-5-sulfochloride, naphthoquinone-1,2-diazide-4-sulfochloride, naphthoquinone-2,1-diazide-4-sulfochloride, naphthoquinone-2,1-diazide-5-sulfochloride, benzoquinone 1,2-diazide-4-sulfochloride, and 5-methylbenzoquinone-(1,2)-diazide-(2)-4-sulfochloride. The preferred diazo compound employed is naphthoquinone-1,2-diazide-5-sulfochloride. Mixtures of diazides can be employed when desired.

The organosilicon compounds employed in preparing the compounds of the present invention contain a group which is reactive with a reactive group of the quinone diazo compound. In the case of a reactive halo substituent on the quinone diazo compound, the organosilicon compound contains a reactive hydrogen group and/or reactive alkali metal group such as a sodium or lithium group and/or epoxy group. The reactive hydrogen group present on the organosilicon compound can be in the form of a hydroxy group, amino group, or mercapto group.

Examples of suitable organosilicon compounds that can be employed in accordance with the present invention include polysiloxanes, siloxanes, silazanes, silanols, silanes, and silyl compounds. Some examples of organosilicon compounds are represented by the following structural formulas:

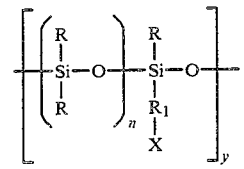

wherein n is an integer from $1-10^4$, preferably $1-10^3$; y is an integer from $1-10^5$, and preferably $1-10^5$; and wherein the siloxane of Formula I has terminal and/or pendant active group such as an epoxy group, or an active hydrogen group such as in the form of an amino group or a hydroxyl group.

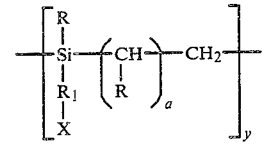

wherein a is 0 or 2; y is an integer of from $1-10^6$; and preferably from $1-10^5$; $R_1$ is $(CH_2)_a$ or phenylene; and X is reactive group such as an epoxy group or hydrogen group such as OH or $NH_2$ or SH.

III

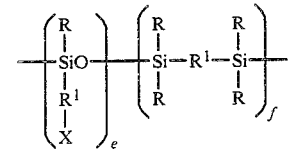

wherein e is an integer of from 1 to $10^4$; and preferably from 1 to $10^3$, f is an integer from 1 to $10^6$, and preferably from 1 to $10^5$; each $R_1$ individually is $(CH_2)_g$ wherein g is an integer of from 1 to 10 and preferably 1 to 3; or phenylene; and X is a reactive group such as $NH_2$, OH, SH, and epoxy group.

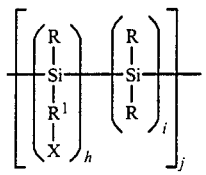

wherein h is an integer from 1 to $10^4$; and preferably from 1 to $10^3$; i is an integer from 1 to $10^4$, and preferably from 1 to $10^3$, j is an integer from 1 to $10^6$, and preferably from 1 to $10^5$; $R^1$ is $-(CH_2)_k$ wherein k is an integer from 1 to 10, and preferably 1 to 3, or phenylene; and X is a reactive epoxy group or reactive hydrogen group such as OH, $NH_2$, and SH.

$$X-(CH_2)_l Si(OR)_3 \qquad V$$

wherein l is an integer of 1–5 and preferably 3; and X is a reactive epoxy group or reactive hydrogen group such as $NH_2$, OH, and SH.

Suitable silazane compounds include compounds of the above formulas, except that Si—O bonds are replaced with Si—N bonds.

The R radicals in the above formulas I through V are well-known and are typified by radicals usually associated with silicon-bonded organic groups and silicon-bonded hydrogen groups. Each R radical in the above formulas I through V is individually selected from the group of hydrogen, monovalent hydrocarbon radicals, halogenated monovalent hydrocarbon radicals, epoxy groups, mercapto radicals, and cyanoalkyl radicals. Thus, the radical R may be alkyl, such as methyl, ethyl, propyl, butyl, octyl; aryl radicals such as phenyl, tolyl, xylyl, napthyl radicals; aralkyl radicals such as benzyl, phenylethyl radicals; olefinically unsaturated monovalent hydrocarbon radicals such as vinyl, allyl, cyclohexenyl radicals; cycloalkyl radicals such as cyclohexyl, cycloheptyl; halogenated monovalent hydrocarbon radicals such as dichloropropyl, 1,1,1-trifluoropropyl, chlorophenyl, dibromophenyl, chloromethyl, and other such radicals; cyanoalkyl radicals such as cyanoethyl, and cyanopropyl. Preferably, the radicals represented by R have less than eight carbon atoms and in particular it is preferred that R be methyl, ethyl, or phenyl.

Examples of some suitable siloxanes within the scope of structure I are

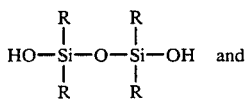

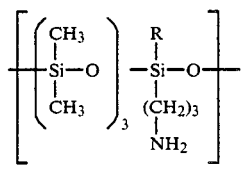

An example of a suitable compound with the scope of Formula II is

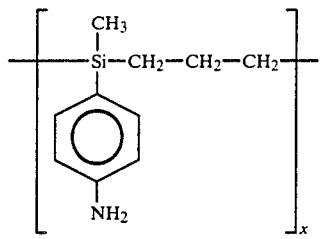

Examples of suitable compounds within the scope of Formula V include gamma aminopropyltriethoxy silane, gamma hydroxy propyltriethoxy silane, and (N-beta(amino-ethyl)-gamma aminopropyltrimethoxy silane. Examples of other suitable compounds are bis-γ-5-aminobutyl tetra alkyl (or-aryl) disiloxanes; bis-γ-aminopropyl tetra alkyl (or-aryl) disiloxanes; and bis-γ-hydroxy tetra alkyl (or-aryl) disiloxanes.

Negative resist materials can be formed by providing amino functionality and/or epoxide functionality on the organosilicon compound. Positive resist materials can be formed by providing hydroxyl or phenolic functionality on the organosilicon compound.

The organosilicon compounds employed usually include about at least 0.01% by weight of reactive group such as reactive hydrogen per molecule and up to about 2% by weight of reactive group such as reactive hydrogen per molecule. Mixtures of organosilicon compounds can be employed if desired.

Since the quinone diazo compounds and the various organosilicon compounds are incompatible to a large extent with each other, it is quite surprising that such react and form the types of products obtained in accordance with the present invention.

The reaction products achieved in accordance with the present invention should provide sufficient absorption of light so that the radiation which is incident upon it will be adequately absorbent throughout a film to thereby cause crosslinking or further polymerization in the case of negative resist and destruction of polymer in the case of positive resist.

The reaction products in accordance with the present invention can be monomeric materials which could be employed as positive resists, or negative resists. Also, monomeric reaction products can be employed in resists admixed with additional siloxane material. Preferably, however, the reaction products are polymeric materials and most preferably are negative resists. Although the reaction products of the present invention can include only one moiety from the quinone diazo compound per molecule, it is preferred that the reaction products contain at least two moieties and most preferably at least 28 moieties from said diazo compound per molecule. The interreaction products of the present invention can have molecular weights from monomeric materials up to about $10^6$, and preferably about $10^3$ to about $10^5$.

In addition, it is preferred that the quinone moieties be pendant groups rather than end groups on the compounds to provide better crosslinking density in the case of negative resist materials, and increased thermal stability.

In addition, it is noted that the compounds of the present invention can be admixed with conventional additives such as fillers, plasticizers, and the like. The reaction between the quinone diazo compound and organosilicon compound, in accordance with the present invention, is usually carried out in the presence of an acid acceptor and especially, an HCl acceptor such as alkali metal carbonates including sodium and potassium carbonates; pyridine and tertiary organic amines. The reaction is usually carried out at temperatures of about normal room temperature to about 60° C. and preferably about normal room temperature. The reaction is generally carried out under atmospheric pressure or in an inert atmosphere. However, higher or lower pressure can be employed when desired. The reaction usually takes between 15 minutes and about 24 hours and preferably, between about 2 and about 6 hours. Equimolar amounts of functional organosilicon compound to diazo compound and excess acceptor are preferably used.

When used as a lithographic material, the compositions of the present invention are applied to a desired substrate to provide films generally about 1500 angsroms to about 1 mil thick, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

In addition, the materials of the present invention can be used in conjunction with those substrates employed as chip carriers and including ceramic substrates and especially multilayer ceramic devices. Also included are dielectric substrates which can be thermoplastic and/or thermosetting polymers. Typical thermosetting polymeric materials include epoxy, phenolic-based materials, polyamides and polyimides. The dielectric materials may be molded articles of the polymers containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins, such as polypropylene; polysulfones, polycarbonates, nitrile rubbers, and ABS polymers.

The compositions of the present invention, after being coated to the desired thickness upon a substrate, are exposed to the imaging radiation such as ultraviolet light radiation including near U.V., mid U.V., and deep U.V.; X-ray beam radiation; neutron radiation; and electron-beam radiation. In the case of negative resist materials, depending upon solubility characteristics of the specific material, the unexposed portions can be removed with solvents such as alcohols such as isopropanol, and isoamyl alcohol; aromatics such as toluene and xylene; ketones such as methyl isobutyl ketone and cyclohexanone; esters such as n-butyl acetate and isoamylacetate; N-methyl pyrrolidone; freon; and 1,1,1 trichloroethylene. In the case of positive resist materials, in accordance with the present invention, such can be developed by contacting the exposed portions with an aqueous alkaline solution such as potassium hydroxide or alcohol solution of tetramethylammonium hydroxide.

The compositions, as employed above, can then be used in a plasma etching of the underlying substrates since such are resistant to the conditions of the plasma etching. For instance, compositions of the present invention are resistant to reactive ion etching in oxygen plasma and are only etched to the extent of about 10 to 20 angstroms per minute. This compares to an etch rate of the underlying substrate such as a polyimide of about 500 to about 1000 angstroms per minute.

The following non-limiting examples are presented to further illustrate the present invention:

EXAMPLE 1

About 10.82 grams of naphthoquinone-1,2-diazide-5-sulfochloride and about 30.2 grams of a silanol terminated polydiphenyl siloxane are reacted in the presence of about 30 grams of potassium carbonate at about 20° to 60° C. for about 5 hours with pyridine in about 300 milliliters of isoamylacetate. The product is then removed from the reaction mass by filtration.

The material is then coated onto a blank substrate to a thickness of about 2000 angstroms. The material is exposed to U.V. irradiation of about 2000 to about 4500 angstroms wavelength. The exposed material is removed by washing with a basic solution such as a KOH 10% aqueous solution or 10% tetramethyl ammonium hydroxide solution in alcohol.

The etch rate in oxygen plasma of this material is about 14 angstroms/minute at 10 m Torr pressure.

EXAMPLE 2

About 13.5 grams of naphthoquinone-1,2-diazide-5-sulfochloride and about 5.4 grams of diphenyl silanediol are reacted in the presence of about 21 grams of potassium carbonate in about 200 milliliters of cyclohexanone at about 20°-60° C. for up to about 5 hours. The product is then removed from the reaction mass by filtration.

The material is then coated onto a blank substrate to a thickness of about 2000 angstroms. The material is exposed to U.V. irradiation of about 2000 to about 4500 wavelength. The exposed material is removed by washing with a basic solution such as a 10% KOH aqueous solution or 10% tetramethyl ammonium hydroxide solution in alcohol.

The etch rate in oxygen plasma of this material is about 14 angstoms/minute at 10 m Torr pressure.

EXAMPLE 3

About 7 parts by weight of naphthoquinone-1,2-diazide-5-sulfochloride and about 26.5 parts of aminopropyl containing siloxane oligomer are reacted in the presence of about 30 parts by weight of potassium carbonate and 3 parts by weight of pyridine in about 300 ml of isoamyl acetate at about 60° C. for about 2 hours and at about 20° C. for about 78 hours. The product is then removed from the reaction mass by filtration.

The material is then coated onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with isoamyl acetate.

The etch rate in oxygen plasma of this material is about 14 angstroms/minute at 10 m Torr pressure.

EXAMPLE 4

About 5.4 grams of naphthoquinone-1,2-diazide-5-sulfochloride and about 20 grams of a siloxane oligomer terminated with 3-glycidoxylpropyl dimethyloloxy groups are reacted in the presence of about 30 grams of potassium carbonate in about 200 milliliters of cyclohexanone at about 20° to 60° C. for up to about 6 hours. The product is then removed from the reaction mass by filtration.

The material is then coated onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with cyclohexanone.

The etch rate in oxygen plasma of this material is about 14 angstroms/minute at 10 m Torr pressure.

EXAMPLE 5

About 27 grams of naphthoquinone-1,2-diazide-5-sulfochloride and about 35 grams of hydroxyl terminated polydimethylsiloxane of molecular weight of about 400–700 are reacted in the presence of about 30 grams of potassium carbonate in about 200–400 milliliters of xylene at about 30° C. to about 60° C. for up to about 5 hours. The product is then removed from the reaction mass by filtration.

The material is then coated onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with xylene.

The etch rate in oxygen plasma of this material is aobut 14 angstoms/minute at 10 m Torr pressure.

EXAMPLE 6

About 5.4 grams of naphthoquinone-1,2-diazide-5-sulfochloride and about 45 grams of hydroxyl terminated polydimethylsiloxane of molecular weight of about 5000 are reacted in the presence of about 30 grams of potassium carbonate in about 200–400 milliliters of xylene at about 30° C. to 60° C. for up to about 5 hours. The product is then removed from the reaction mass by filtration.

The material is then coated onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with xylene.

The etch rate in oxygen plasma of this material is about 14 angstroms/minute at 10 m Torr pressure.

EXAMPLE 7

About 27 grams of naphthoquinone-1,2-diazide-5-sulfochloride and about 12.4 grams of 1,3 bis($\gamma$-aminopropyl) 1,1,3,3-tetramethyl disilazane are reacted in the presence of about 8 grams of pyridine in about 280 milliliters of isoamyl acetate at about 20° C. to 60° C. for up to about 6 hours. The product is then removed from the reaction mass by filtration. The material is then coated onto a blank substrate to a thickness of about 2000 agnstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with isoamyl acetate.

The etch rate in oxygen plasma of this material is about 14 angstroms/minute at 10 m Torr pressure.

EXAMPLE 8

About 27 grams of naphthoquinone-1,2-diazide-5-sulfochloride and about 14 grams of 1,3 bis-($\gamma$-hydroxy)4,1,3,3-tetramethyldisiloxane are reacted in the presence of about 10 grams of pyridine in about 300 milliliters of isoamyl acetate at about 30° C. to 60° C. for up to about 6 hours. The product is then removed from the reaction mass by filtration.

The material is then coated onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with isoamyl acetate.

The etch rate in oxygen plasma of this material is about 14 angstroms/minute at 10 m Torr pressure.

EXAMPLE 9

Example 8 is repeated, except that about 13 grams of the disiloxane are employed. The results obtained are similar to those from Example 8.

EXAMPLE 10

About 5 grams of naphthoquinone-1,2-diazide-5-sulfochloride and about 30 grams of polydimethyl siloxane oligomer, aminopropyldimethylsiloxy-terminated having a molecular weight of 10,000 to 30,000 are reacted in the presence of about 10 grams of pyridine in about 300 milliliters of xylene at about 30° C. to 60° C. for up to about 6 hours. The product is then removed from the reaction mass by precipitation in about 0.5 liters of methanol and then placed in a vacuum over for about 24 hours at about 20° C. to 60° C.

The material is then coated onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with xylene.

The etch rate in oxygen plasma of this material is about 14 angstroms/minute at 10 m Torr pressure.

EXAMPLE 11

About 10 grams of naphthoquinone-1,2-diazide-5-sulfochloride and about 30 grams of linear aminopropyl containing polysiloxane oligomer of molecular weight of about 30,000 are reacted in the presence of about 30 grams of potassium carbonated in about 300 milliliters of xylene at about 30° C. to 60° C. for up to about 16 hours. The product is then removed form the reaction mass by filtration.

The material is then coated onto a blank substrate to a thickness of about 2000 agnstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with xylene.

The etch rate in oxygen plasma of this material is about 14 angstroms/minute at 10 m Torr pressure.

EXAMPLE 12

About 5 grams naphthoquinone-1,2-diazide-5-sulfochloride and about 18 grams of a organosilicon copolymer having the following repeating units:

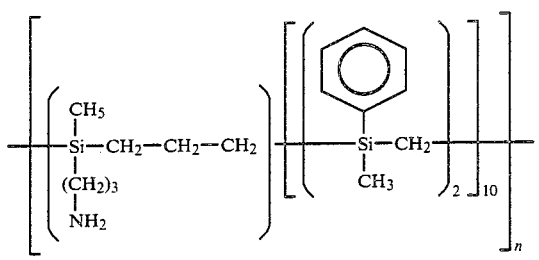

are reacted in the presence of about 6 grams of pyridine in 200 milliliters of toluene for about 5 hours at about 60° C. The product is then removed from the reaction mass by precipitation from about 400 milliliters of methanol and then placed in a vacuum oven at about 55° C. for about 3 to 5 hours.

The material is then coated from a 10% solution in isoamylacetate onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with isoamyl acetate.

The etch rate in oxygen plasma of this material is about 14 angstroms/minute at 10 m Torr pressure.

EXAMPLE 13

About 27 grams of naphthoquinone-1,2-diazide-5-sulfochloride and about 46 grams of a polysiloxane having the following repeating units:

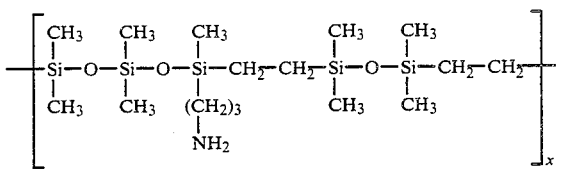

are reacted in the presence of about 30 grams of pyridine in about 500 milliliters of toluene at about 25° C. for about 24 hours. The product is then removed from the reaction mass by precipitation in about 400 milliliters of methanol and then placed in a vacuum oven at about 55° C. for about 3 to 5 hours.

The material is then coated from a 10% solution in isoamylacetate onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with isoamyl acetate.

The etch rate in oxygen plasma of this material is about 14 angstroms/minute at 10 m Torr pressure.

EXAMPLE 14

About 5 parts by weight of naphthoquinone-1,2-diazide-5-sulfochloride and about 26 grams of an organosilicon polymer having the following recurring units:

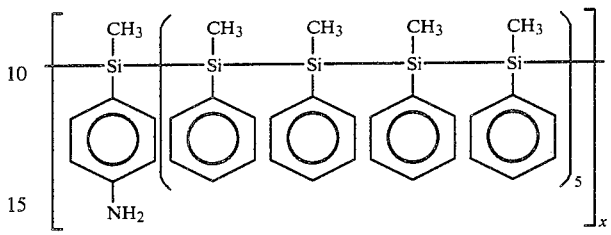

are reacted in the presence of about 10 grams of pyridine in about 200 milliliters of toluene at about 25° C. for about 25 hours. The product is then removed from the reaction mass by precipitation from about 100 milliliters of methanol and then placed in a vacuum oven at about 55° C. for about 3 to 5 hours.

The material is then coated from a 10% solution in isoamyl acetate onto a blank substrate to a thickness of about 2000 angstroms. The material is exposed to U.V. irradiation of about 2000 to about 4500 wavelength. After this, the exposed material is post-baked at about 80° C. for about 2 minutes in order to complete crosslinking reaction and the unexposed material is removed by washing with isopropyl alcohol.

The etch rate in oxygen plasma of this material is about 14 angstroms/minute at 10 m Torr pressure.

The polymers of the present invention prepared in the above examples all have relatively high molecular weight in the order of about ½ million. In addition, the yield of desired product from all of the above examples is at least 80% based upon the amount of starting reactants. Also, the etch rates obtained are substantially the same.

What is claimed is:

1. A composition of matter formed by the interreaction of
   (A) A quinone diazo compound and
   (B) an organosilicon compound containing groups reactive with said quinone diazo compound and being selected from the group of diphenyl silanediol, hydroxyl terminated polydimethyl siloxane, 1,3 bis (γ-hydroxy) 4,1,3,3-tetramethyl disiloxane, organosilicon compound containing an amine functionality or epoxide functionality, and when said organosilicon compound contains an amine functionality or epoxide functionality, said composition is a negative resist material.

2. The composition of claim 1 wherein said diazo compound contains reactive acid or reactive halo groups.

3. The composition of claim 1 wherein said diazo compound contains reactive group selected from the group of halogen groups, acid groups, and sulfonyl halide groups.

4. The composition of claim 1 wherein said diazo compound is a quinone-(1,2)-diazide.

5. The composition of claim 1 wherein said diazo compound is from a benzoquinone diazide or naphthoquinone diazide, or mixtures thereof.

6. The composition of claim 1 wherein said diazo compound is naphthoquinone-1,2-diazide-5-sulfochloride.

7. The composition of claim 1 wherein said organosilicon compound contains at least 0.01% by weight of a group reactive with said quinone diazo compound.

8. The composition of claim 1 wherein said organosilicon compound contains up to about 2% by weight of groups reactive with said quinone diazo compound.

9. The composition of claim 1 wherein said organosilicon compound contains an amine functionality or epoxide functionality and wherein said composition is a negative resist material.

10. The composition of claim 9 wherein said organosilicon compound comprises an aminopropyl containing siloxane oligomer.

11. The composition of claim 9 wherein said organosilicon compound comprises a siloxane oligomer terminated with 3-glycidoxpropyl dimethyloloxy groups.

12. The composition of claim 9 wherein said organosilicon compound comprises 1,3 bis (γ-aminopropyl) 1,1,3,3-tetramethyl disiloxane.

13. The composition of claim 9 wherein said organosilicon compound comprises linear aminopropyl containing polysiloxane oligomer of molecular weight of about 30,000.

14. The composition of claim 9 wherein said organosilicon compound comprises a polydimethylsiloxane oligomer, aminopropyl dimethylsiloxy-terminated having a molecular weight of 10,000 to 30,000.

15. The composition of claim 9 wherein said organosilicon compound comprises an organosilicon copolymer having the following repeating units:

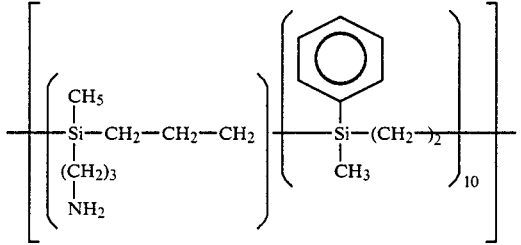

16. The composition of claim 13 wherein said organosilicon compound comprises an organosilicon copolymer having the following recurring units:

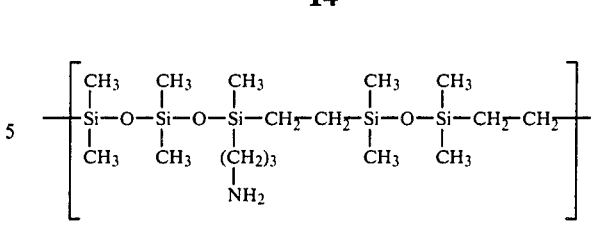

17. The composition of claim 13 wherein said organosilicon compound comprises an organosilicon copolymer having the following recurring units:

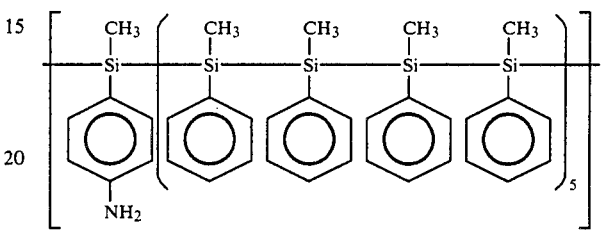

18. The composition of claim 1 wherein said organosilicon compound comprises diphenyl silanediol.

19. The composition of claim 1 wherein said organosilicon compound comprises hydroxyl terminated polydimethyl siloxane.

20. The composition of claim 1 wherein said organosilicon compound comprises 1,3 bis (γ-hydroxy) 4,1,3,3-tetramethyl disiloxane.

21. A process for preparing a composition which comprises reacting a quinone diazo compound and an organosilicon compound containing groups reactive with said quinone diazo compound in the presence of an acid acceptor, and wherein said organosilicon compound is selected from the groups of diphenyl silanediol, hydroxyl terminated polydimethyl siloxane, 1,3 bis (γ-hydroxy) 4,1,3,3-tetramethyl disiloxane, organosilicon compound containing an amine functionality or epoxide functionality, and when said organosilicon compound contains an amine functionality or epoxide functionality, said composition is a negative resist material.

22. The process of claim 15 wherein said acid acceptor is selected from the group of alkali metal carbonates, pyridine, and tertiary organic amines.

23. The process of claim 15 wherein said reaction is carried out at temperatures of about normal room temperature to about 60° C.

24. The process of claim 15 wherein about equal molar amounts of organosilicon to quinone diazo compound are reacted.

* * * * *